United States Patent
Ohta et al.

(10) Patent No.: US 8,587,133 B2
(45) Date of Patent: Nov. 19, 2013

(54) SEMICONDUCTOR DEVICE

(75) Inventors: Mitsuru Ohta, Kanagawa (JP); Tomoki Kato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 260 days.

(21) Appl. No.: 13/222,564

(22) Filed: Aug. 31, 2011

(65) Prior Publication Data

US 2012/0074551 A1  Mar. 29, 2012

Related U.S. Application Data

(63) Continuation of application No. 12/379,178, filed on Feb. 13, 2009, now Pat. No. 8,044,521, which is a continuation of application No. 11/354,124, filed on Feb. 15, 2006, now Pat. No. 7,595,560.

(30) Foreign Application Priority Data

Feb. 22, 2005 (JP) ................................. 2005-046272

(51) Int. Cl.
*H01L 21/02* (2006.01)

(52) U.S. Cl.
USPC ........... 257/784; 257/779; 257/780; 257/793; 257/E23.025; 257/E33.072

(58) Field of Classification Search
USPC .................... 257/779–794, 433, E23.019, 25, 257/33.059, 72
See application file for complete search history.

(56) References Cited

U.S. PATENT DOCUMENTS

| | | | |
|---|---|---|---|
| 5,391,924 A | 2/1995 | Uchida et al. | |
| 5,674,780 A | 10/1997 | Lytle et al. | |
| 6,507,049 B1 * | 1/2003 | Yeager et al. | 257/100 |
| 7,049,214 B2 | 5/2006 | Kawanabe et al. | |
| 7,449,786 B2 | 11/2008 | Kawanabe et al. | |
| 8,044,521 B2 * | 10/2011 | Ohta et al. | 257/784 |
| 8,395,261 B2 * | 3/2013 | Tanaka et al. | 257/738 |

FOREIGN PATENT DOCUMENTS

| | | |
|---|---|---|
| JP | 04-206651 | 7/1992 |
| JP | 4-297042 A | 10/1992 |
| JP | 10-303239 | 11/1998 |
| JP | 2000-150562 A | 5/2000 |
| JP | 2001-308133 A | 11/2001 |
| JP | 2001-308138 A | 11/2001 |
| JP | 2003-133362 A | 5/2003 |
| JP | 2004-244601 A | 9/2004 |
| JP | 2004-303861 A | 10/2004 |
| JP | 2005-032826 A | 2/2005 |

* cited by examiner

*Primary Examiner* — Michael Lebentritt
(74) *Attorney, Agent, or Firm* — Foley & Lardner LLP

(57) ABSTRACT

An improved reliability of a junction region between a bonding wire and an electrode pad in an operation at higher temperature is presented. A semiconductor device includes a semiconductor chip provided on a lead frame, which are encapsulated with an encapsulating resin. Lead frames are provided in both sides of the lead frame. A portion of the lead frame is encapsulated with the encapsulating resin to function as an inner lead. The encapsulating resin is composed of a resin composition that contains substantially no halogen. Further, an exposed portion of the Al pad provided in the semiconductor chip is electrically connected to the inner lead via the AuPd wire.

14 Claims, 20 Drawing Sheets

FIG. 6

|  | WIRE (20 μmφ) | ENCAPSULATING RESIN | ESTIMATED LIFE 175 DEGREE C (F=10%) | LIFE-EXTENSION EFFECT OVER EXPERIMENT 1 (h) |
|---|---|---|---|---|
| EXPERIMENT 1 | Au WIRE | RESIN CONTAINING Br | 974h | — |
| EXPERIMENT 2 | AuPd WIRE | RESIN CONTAINING Br | 1024h | +50h |
| EXPERIMENT 3 | Au WIRE | Br FREE RESIN | 2530h | +1556h |
| EXPERIMENT 4 | AuPd WIRE | Br FREE RESIN | 5940h | +4966h |

DIAMETER OF Au WIRE : 20 μm φ
TRIAL TEMPERATURE : 220 DEGREE C
TRIAL TIME : 48h

FIG. 14

FAILURE MODE A: VOID MODE FOR ALLOY LAYER INTERFACE

ESTIMATED MECHANISM

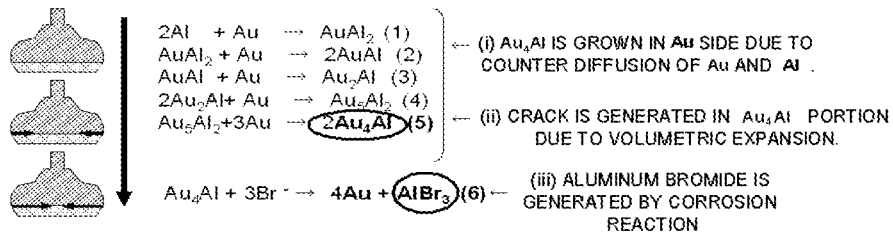

$2Al + Au \rightarrow AuAl_2$ (1)
$AuAl_2 + Au \rightarrow 2AuAl$ (2)
$AuAl + Au \rightarrow Au_2Al$ (3)
$2Au_2Al + Au \rightarrow Au_5Al_2$ (4)
$Au_5Al_2 + 3Au \rightarrow 2Au_4Al$ (5)

← (i) $Au_4Al$ IS GROWN IN Au SIDE DUE TO COUNTER DIFFUSION OF Au AND Al.

← (ii) CRACK IS GENERATED IN $Au_4Al$ PORTION DUE TO VOLUMETRIC EXPANSION.

$Au_4Al + 3Br^- \rightarrow 4Au + AlBr_3$ (6) ← (iii) ALUMINUM BROMIDE IS GENERATED BY CORROSION REACTION IT IS CONSIDERED THAT, SINCE $AlBr_3$ HAS LOWER MELTING POINT (97 DEGREE C), VOLUME THEREOF IS REDUCED IN AMBIENT TEMPERATURE AND THUS VOIDS ARE GENERATED THEREIN.

IN THIS MODE, DOMINANT FACTOR IS GENERATION OF VOIDS DUE TO GENERATION OF $AlBr_3$.

DIAMETER OF Au WIRE : 70 μm φ

TRIAL TEMPERATURE : 200 DEGREE C

TRIAL TIME : 1250h

FIG. 19

FAILURE MODE B: ALLOY LAYER CORROSION MODE

ESTIMATED MECHANISM

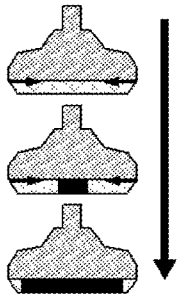

WHEN WIRE DIAMETER IS LARGER, GENERATION OF
VOIDS DOES NOT PROMPTLY CAUSE FAILURE.

IT IS CONSIDERED THAT $Au_4Al$, WHICH IS GENERATED UNDER CONDITION
OF STORAGE AT HIGHER TEMPERATURE FOR LONGER TERM, CREATES
$Au$ AND $AlBr_3$ DUE TO OXIDIZING PROPERTY OF $Br$.

IT IS ALSO CONSIDERED THAT VF FAILURE IS SIGNIFICANTLY
OCCURRED DUE TO HIGHER RESISTANCE OF $AlBr_3$.

$$Au_5Al_2 + 3Au \rightarrow 2Au_4Al \quad (5)$$

$$Au_4Al + 3Br^- \rightarrow 4Au + \boxed{AlBr_3} \quad (6) \quad - \text{OXIDIZING PROPERTY OF Br IN RESIN}$$

IN THIS MODE, DOMINANT FACTOR IS GENERATION
OF LAYER OF $AlBr_3$ THAT HAS HIGHER RESISTANCE

FIG. 20

RELATIONSHIP OF AREAL RATIO OF AuAl ALLOY PORTION
RIGHT AFTER BONDING PROCESS WITH LIFE TIME

| AREAL RATIO OF AuAl ALLOY PORTION (*1) | TIME FOR OCCURRING FAILURE |
|---|---|
| NOT LESS THAN 50% | 895 hrs. |
| LESS THAN 50% | 450 hrs. |

PROCESS TEMPERATURE: 220 DEGREE C
MATERIAL OF BONDING PAD : Al
MATERIAL OF BONDING WIRE : AuPd

*1 (AREAL RATIO OF AuAl ALLOY PORTION)
= (AREA OF AuAl ALLOY PORTION)/(AREA OF AuPd BALL BONDING JUNCTION)

SEMICONDUCTOR DEVICE

CROSS-REFERENCE TO RELATED PATENT APPLICATIONS

This application is a continuation of application Ser. No. 12/379,178, filed Feb. 13, 2009, now pending, which is a continuation of application Ser. No. 11/354,124, filed Feb. 15, 2006, now U.S. Pat. No. 7,595,560, issued Sep. 29, 2009, and based on Japanese Patent Application No. 2005-46272, filed Feb. 22, 2005, by Mitsuru Ohta and Tomoki Kato, all of which are incorporated herein by reference in their entirety. This application claims only subject matter disclosed in the parent applications and therefore presents no new matter.

BACKGROUND OF THE INVENTION

1. Technical Field

The present invention relates to a semiconductor device having a junction of an electrode pad with a bonding wire of a semiconductor chip, which is encapsulated with an encapsulating resin.

2. Related Art

Typical conventional semiconductor devices having an electrode pad and a lead frame on a semiconductor chip, which are connected via wire bonding and encapsulated with an encapsulating resin, are described in Japanese Patent Laid-Open No. H10-303,239 (1998) and Japanese Patent Laid-Open No. H04-206,651 (1992).

Japanese Patent Laid-Open No. H10-303,239 describes that a gold (Au) alloy containing manganese (Mn) as an essential component is employed for forming a bonding wire, and an encapsulating resin containing bromine (Br) or antimony (Sb) is employed. Further, Japanese Patent Laid-Open No. H10-303,239 describes the following aspects. In order to enhance fire retardancy, the encapsulating resin should essentially contain at least one of bromine and antimony, and therefore sufficient encapsulating fire retardant effect can not be obtained if the concentration thereof is less than 0.1% wt. A use of a thin wire of gold alloy essentially containing Mn can enhance fire retardancy without deteriorating reliability, even if contents of bromine and antimony is increased as compared with conventional formulation. Although it is found that an addition of single palladium (Pd) allows decreasing a growing rate of a compound phase, the inhibition effect for a corrosion is not sufficient. In particular, in order to obtain sufficient effect of delaying a corrosion in a long time-heating process that provides a condition of a corrosion corresponding to a status, in which a corrosion extensively proceeds over the compounds, it is necessary to select an addition of Pd of greater than about 1% wt. However, an inclusion of Pd at higher concentration causes problems, in which a flat geometry of a ball junction may be formed, or a silicon substrate is damaged during a formation of a junction due to a hardening of the ball junction. Although decreased quantity of additional Pd can provide acceptable geometry of the ball junction, a problem of a reduced inhibition for the corrosion is caused after the compound is sufficiently grown in the junction by heating for longer time. An increase of electric resistance, which has been otherwise difficult to be inhibited by adding Pd alone, can be sufficiently inhibited by jointly adding manganese (Mn), and therefore even a smaller quantity of Pd can considerably enhance the effect for inhibiting a progress of the corrosion. For these reasons, combined use of Mn and Pd is effective for inhibiting the progress of the corrosion in both shorter and longer term.

On the other hand, Japanese Patent Laid-Open No. H04-206,651 describes a semiconductor device obtained by: producing a structure by mounting a semiconductor chip on a die pad of a lead frame and forming an electrical connecting with a bonding pad via a bonding wire; coating the obtained structure with a protective layer that includes no fire retardant agent or no fire retardant auxiliary agent; and coating the circumference thereof with a fire retardant resin.

SUMMARY OF THE INVENTION

However, the present inventors have examined the technology described in the above-described Japanese Patent Laid-Open No. H10-303,239 and Japanese Patent Laid-Open No. H04-206,651, and found that there is room for improving a reliability in a junction of the electrode pad with the bonding wire for operating at higher temperature.

Therefore, the present inventors have made investigations for semiconductor devices having configurations, in which aluminum (Al) is employed for the material of the electrode pad, the bonding wire is a pure gold (Au) wire, and Br is contained in the encapsulating resin as a halogen. As a result, it is found that, when a semiconductor device including an encapsulating resin containing Br and Au wire is stored at higher temperature, a failure is generated by a progress of reactions presented by the following formula (1) to formula (6). Here, specific matters of the investigations will be discussed later.

$$2Al + Au \rightarrow AuAl_2 \quad (1)$$

$$AuAl_2 + Au \rightarrow 2AuAl \quad (2)$$

$$AuAl + Au \rightarrow Au_2Al \quad (3)$$

$$2Au_2Al + Au \rightarrow Au_5Al_2 \quad (4)$$

$$Au_5Al_2 + 3Au \rightarrow 2Au_4Al \quad (5)$$

$$Au_4Al + 3Br^- \rightarrow 4Au + AlBr_3 \quad (6)$$

Consequently, the present inventors have conducted investigations for further improving the reliability in long term-operation at higher temperature, in view of preventing the reactions presented by the above-described formula (1) to formula (6) from being induced, based on the above-described scientific knowledge. As a result, it is found that the reliability in the operation at higher temperature can be considerably improved by employing a configuration of being substantially free of Br and a configuration of having a bonding wire of an Au alloy containing a predetermined metal, in stead of employing a conventional configuration of employing a resin composition containing Br at least a region in the encapsulating resin, and thus leading to provide the present invention.

According to one aspect of the present invention, there is provided a semiconductor device, comprising: a semiconductor chip; an electrode pad provided in said semiconductor chip; and a wire that connects a connecting terminal provided outside of said semiconductor chip and said semiconductor chip; said electrode pad and said wire being encapsulated with an encapsulating resin, said wire including a metal having a chemical formulation presented by formula (I), and said encapsulating resin containing substantially no halogen:

$$AuM \quad (I)$$

(wherein M includes at least one selected from the group consisting of palladium (Pd), copper (Cu), silver (Ag) and platinum (Pt)).

Since the wire contains the metal having a chemical formulation presented by the above-described formula (I), a counter diffusion of Au with the metal composing the electrode pad occurred in the operation at higher temperature can be inhibited. Further, since halogen is not substantially contained in the encapsulating resin, corrosion caused by halogen can be inhibited. Consequently, a generation of a crack due to a growth of a region containing Au and the metal composing the electrode pad can be inhibited, and a generation of a void and/or a discoloration due to a generation of halide can also be inhibited. Consequently, these synergistic effects can provide an inhibition to a generation of failure in a junction region between the bonding wire and the electrode pad during an operation at higher temperature, thereby providing an improved reliability.

In this specification, the metal presented by the above-described formula (I) in this specification means a metal containing Au and M, and is typically represented by, for example, an alloy of Au with M.

Further, in this specification, "the encapsulating resin contains substantially no halogen" means a configuration, in which halogen is not intentionally added to any of resins in a composition composing the encapsulating resin and additives such as fire retardant agent and the like, and is typically represented by, for example, a status that a halogen concentration in a resin composition is equal to or less than 100 ppm.

According to the present invention, a technology for improving the reliability in the junction region between the bonding wire and the electrode pad containing Al during an operation at higher temperature can be achieved by providing the configuration, in which the wire contains the metal having a chemical formulation presented by the above-described formula (I), and the encapsulating resin contain substantially no halogen.

BRIEF DESCRIPTION OF THE DRAWINGS

The above and other objects, advantages and features of the present invention will be more apparent from the following description taken in conjunction with the accompanying drawings, in which:

FIG. 6 is a table, describing formulations of the material for the semiconductor device and the life of the device under the condition of the storage at higher temperature in an example;

FIG. 14 is a schematic diagram, describing the mechanism of a failure occurred in the conventional semiconductor device;

FIG. 19 is a schematic diagram, describing the mechanism of a failure occurred in the conventional semiconductor device.

FIG. 20 is a table, describing a relationship of areal ratio of an AuAl alloy portion right after a bonding process with life time for the semiconductor device of an example.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, an identical numeral is assigned to an element commonly appeared in the figures, and the detailed description thereof will not be presented.

First of all, for the purpose of enhancing the understanding of the present invention, the mechanism of the failure occurred in the operation of the conventional semiconductor device at higher temperature described above will be described.

Figure 9:
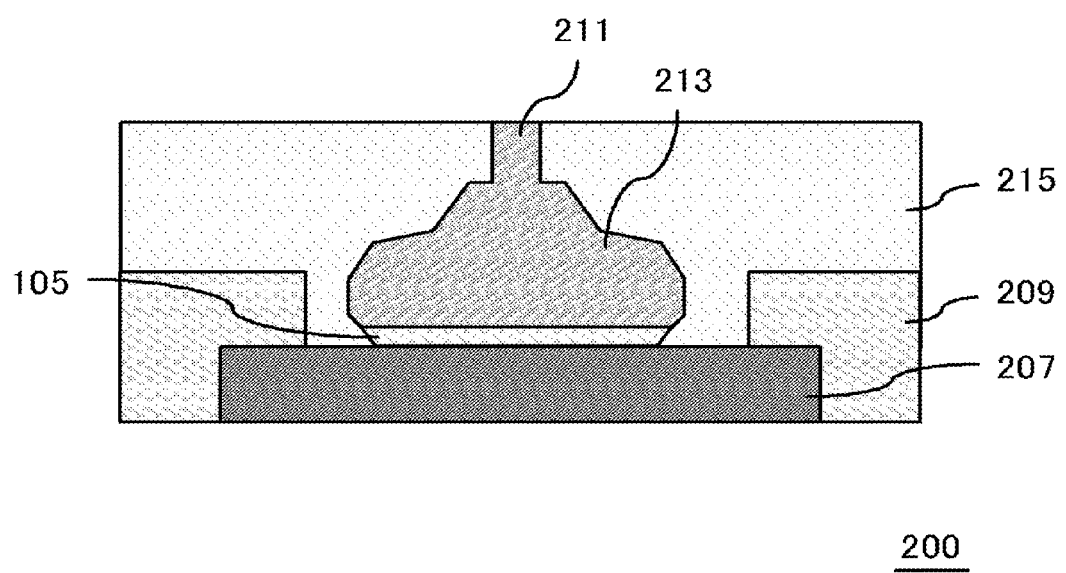
FIG. 9 is a cross-sectional view, illustrating a configuration of a conventional semiconductor device.

FIG. 9 is a cross-sectional view, illustrating a configuration of a semiconductor device that is employed for investigations. A semiconductor device 200 shown in FIG. 9 has a configuration, in which a multiple-layered film (not shown) including an interconnect layer and an insulating interlayer is provided on a silicon substrate (not shown). An Al pad 207 is provided in a predetermined location on the multilayered film (not shown), and an polyimide film 209 covers an entire side surface and a portion of an upper surface of the Al pad 207. Another portion of the upper surface of the Al pad 207, which is not coated by the polyimide film 209, is exposed, and an Au wire 211 is connected to the exposed portion. An Au ball 213 is formed in a leading edge of the Au wire 211, which is a connecting portion with the Al pad 207, where the Al pad 207 is joined to the Au ball 213. An encapsulating resin 215, which is composed of a resin composition containing brominated epoxy resin, is provided on the entire upper surface of the polyimide film 209 to cover the junction between the Al pad 207 and the Au ball 213.

Concerning the semiconductor devices 200 (FIG. 9) having different diameters of Au wire 211, life under the conditions of being stored at higher temperature was evaluated and factors for causing the junction failure were investigated. As a result, following factors for causing defects in the junction to the bonding wire in operations at higher temperature have been found.

Figure 10:
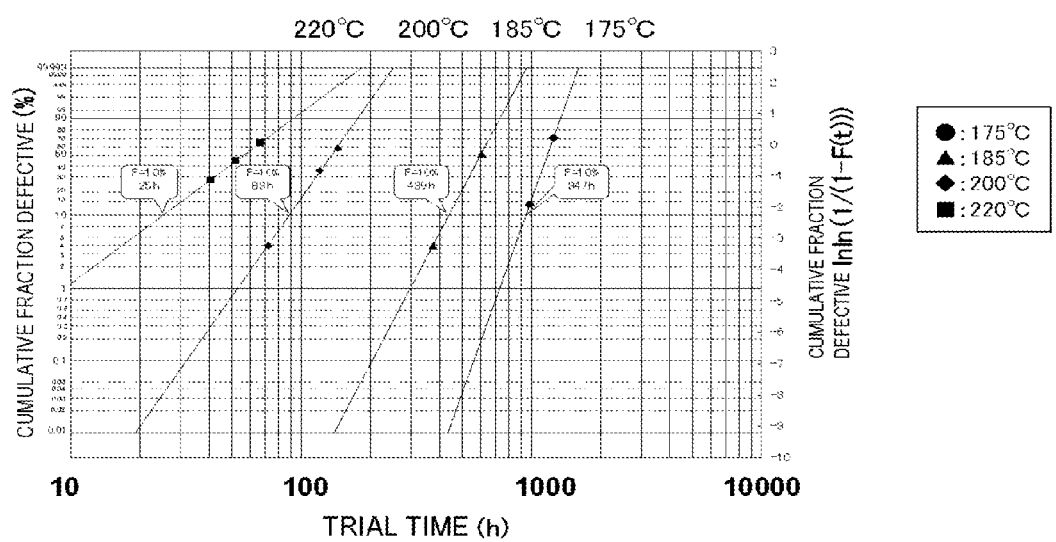
FIG. 10 is a graph, showing a Weibull distribution of life of a conventional semiconductor device.

FIG. 10 is a graph, showing plots of a Weibull distribution of life of the Au wire 211 under the storage conditions that the devices are stored at 175 degree C., 185 degree C., 200 degree C. and 220 degree C., for the Au wire 211 having a diameter of 20 μm. As can be seen from FIG. 10, it is clarified that higher storage temperature provides shorter time that is required for reaching the cumulative fraction defective to 10%.

Further, trials under the conditions of having different wire diameters of the Au wire 211 and different storage temperatures were carried out to conduct an analysis in the failure mechanism.

First of all, investigations were carried out for the case of having the wire diameter of the Au wire 211 of 20 μm.

Figure 11:
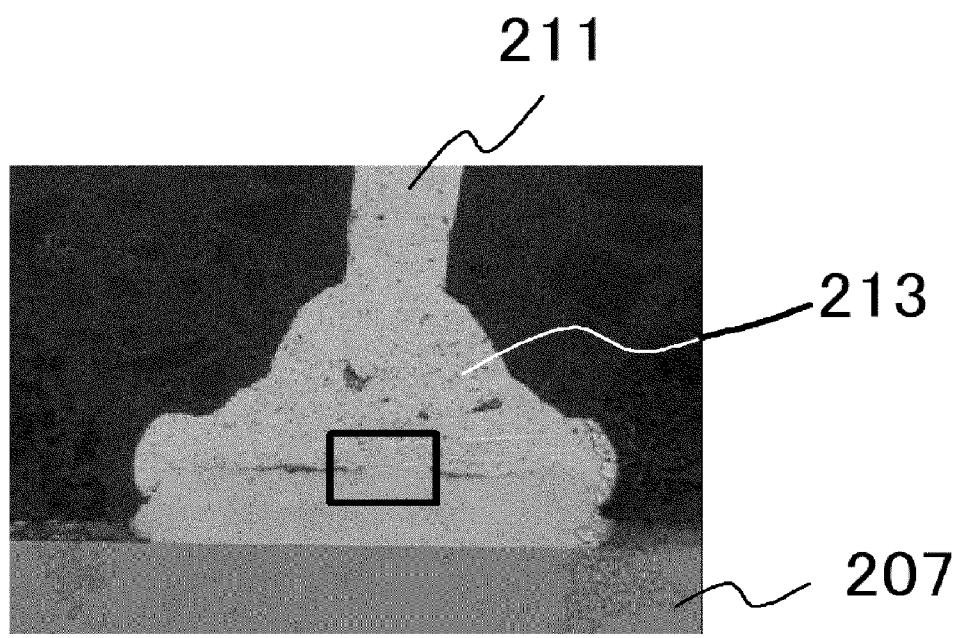
FIG. 11 is a view showing an optical microscope image of a cross section a conventional semiconductor device, useful in describing a mechanism of a failure occurred in the conventional semiconductor device.
Figure 12:
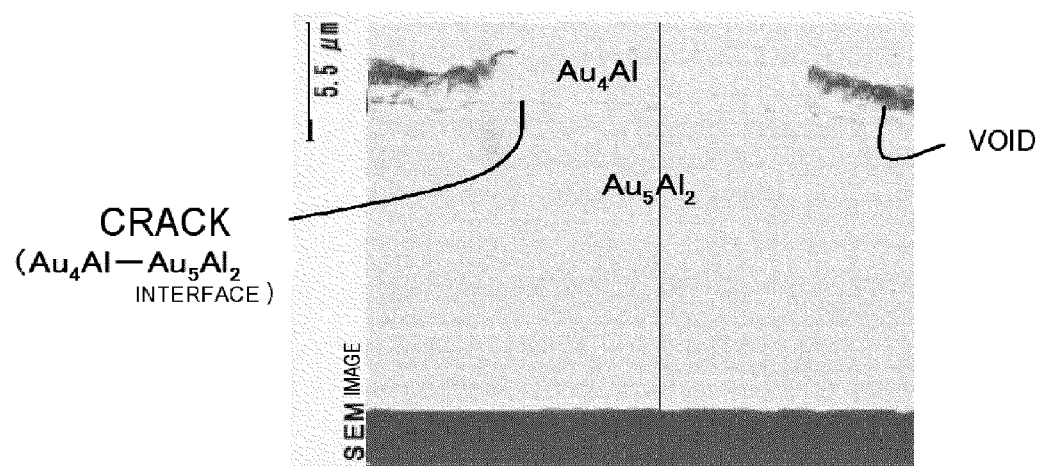
FIG. 12 is a view showing an SEM image of a cross section a conventional semiconductor device, useful in describing a mechanism of a failure.

The semiconductor device 200 was stored at 220 degree C. for 48 hours. After the storage under such condition, the semiconductor device 200 was cooled to an ambient temperature, and then an observation of a junction between the Al pad 207 and the Au ball 213 by means of scanning electron microscope (SEM) was conducted. FIG. 11 is a view showing an optical microscope image of cross sections of the Al pad 207, the Au ball 213 and the Au wire 211, and FIG. 12 is a view showing an SEM image of an enlarged view of a region surrounded with a square in FIG. 11. As can be seen from FIG. 11 and FIG. 12, cracks were generated at an interface between an $Au_4Al$ layer and an $Au_5Al_2$ layer in this sample, and further, voids were created in the $Au_4Al$ layer.

Figure 13:
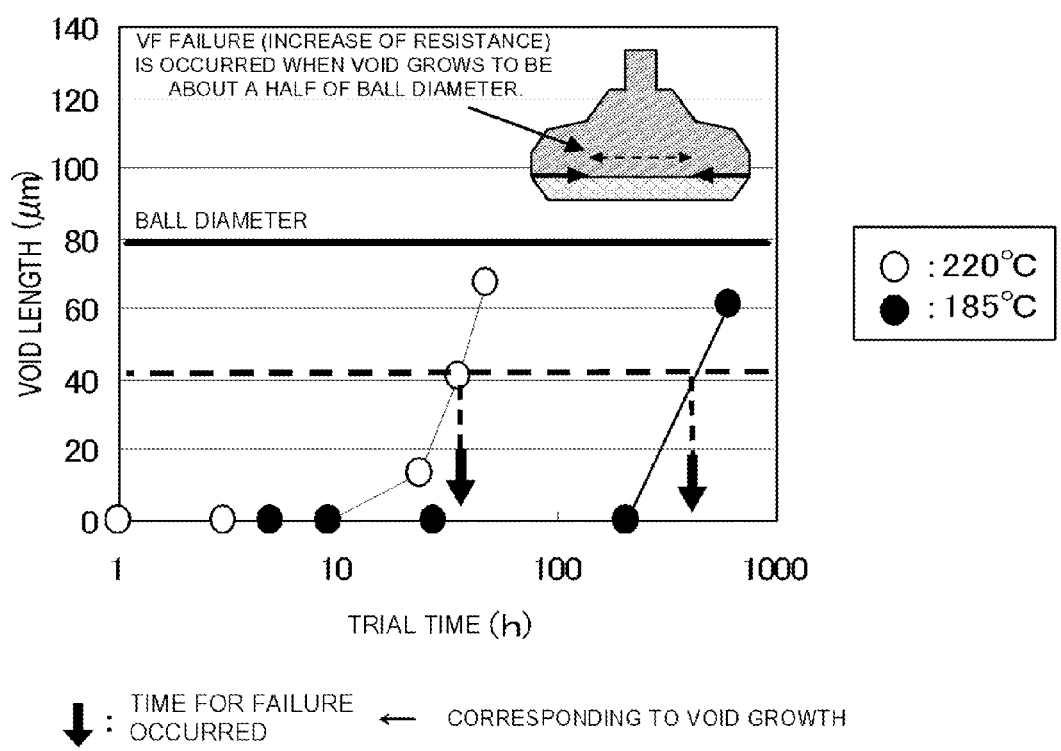
FIG. 13 is a graph, showing a relationship of growing length of void with trial time in the conventional semiconductor device, useful in describing a mechanism of a failure.

FIG. 13 is a graph, showing a relationship of growing length of void (μm) with trial time (hr) in the semiconductor device 200 employing the Au wire 211 having a wire diameter of 20 μm under the conditions of being stored at 185 degree C. and 220 degree C., together with a failure generation time. As shown in FIG. 13, a ball diameter of the Au ball 213 was 80 μm. The failure generation time means a time, at which a VF (forward voltage) failure is detected, and is indicated by each of downward arrows in FIG. 13. It can be seen from FIG. 13 that failure generations were detected when the void was grown to a length of around 40 μm in both cases of storages at 185 degree C. and at 220 degree C. It is considered from the results that a VF failure due to an increase of the resistance is occurred, when the void is grown to have a dimension that is about a half of the diameter of the Au ball 213.

By summarizing the above results and knowledge, it can be considered that the failure is generated according to the following mechanism, when the Au wire 211 having the wire diameter of 20 μm is employed. FIG. 14 is a schematic diagram, describing the mechanism of the generation of failure. Following formula (1) to formula (6) represent chemical reactions that are considered to be generated in the junction between the Al pad 207 and the Au ball 213:

$$2Al + Au \rightarrow AuAl_2 \quad (1)$$

$$AuAl_2 + Au \rightarrow 2AuAl \quad (2)$$

$$AuAl + Au \rightarrow Au_2Al \quad (3)$$

$$2Au_2Al + Au \rightarrow Au_5Al_2 \quad (4)$$

$$Au_5Al_2 + 3Au \rightarrow 2Au_4Al \quad (5)$$

$$Au_4Al + 3Br^- \rightarrow 4Au + AlBr_3 \quad (6)$$

As shown in FIG. 14 and presented by the above-described formula (1) to formula (6), when the semiconductor device 200 is stored at a higher temperature, reactions presented by the above-described formula (1) to formula (5) are proceeded by a counter diffusion of Au with Al at the interface between the Al pad 207 and the Au ball 213, thereby creating $Au_4Al$ at the Au side or in other words on the bottom of the Au ball 213 (indicated by (i) in FIG. 14). Then, a stress is generated between the $Au_4Al$ layer and the Au layer due to a volumetric expansion caused by a creation of $Au_4Al$, leading to a generation of cracks at these interface (indicated by (ii) in FIG. 14). Further, $Au_4Al$ experiences a corrosive action of bromine ion (Br—) due to brominated epoxy resin contained in the encapsulating resin 215, so that aluminum bromide is generated by the reaction presented by the above-described formula (6). Since aluminum bromide ($AlBr_3$) generated by the reaction presented by the above-described formula (6) has lower melting point of 97 degree C., it is considered that the volume is reduced at an ambient temperature to cause a void condition (indicated by (iii) of FIG. 14). Consequently, it is considered that, when the Au wire 211 having the wire diameter of 20 μm is employed, the generation of the void due to a generation of $AlBr_3$ according to the chemical reaction presented by the above-described formula (6) is the dominant factor for the generation of the failure.

Next, trials were conducted by selecting 70 μm for the wire diameter of the Au wire 211.

Figure 15:
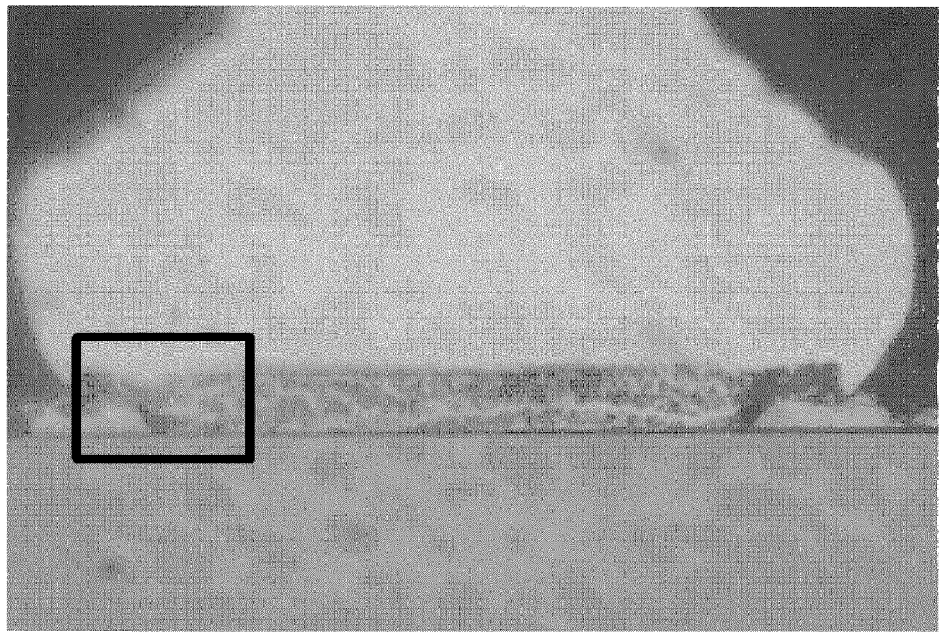
FIG. 15 is a view showing an optical microscope image of a cross section a conventional semiconductor device, useful in describing a mechanism of a failure.
Figure 16:
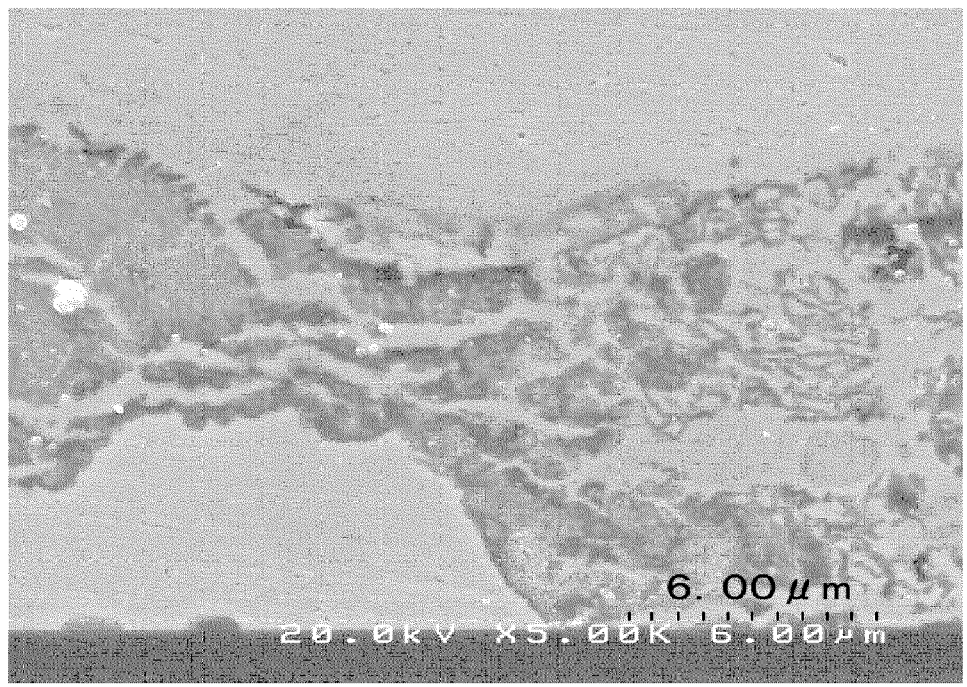
FIG. 16 is a view showing an SEM image of a cross section a conventional semiconductor device, useful in describing a mechanism of a failure.
Figure 17:
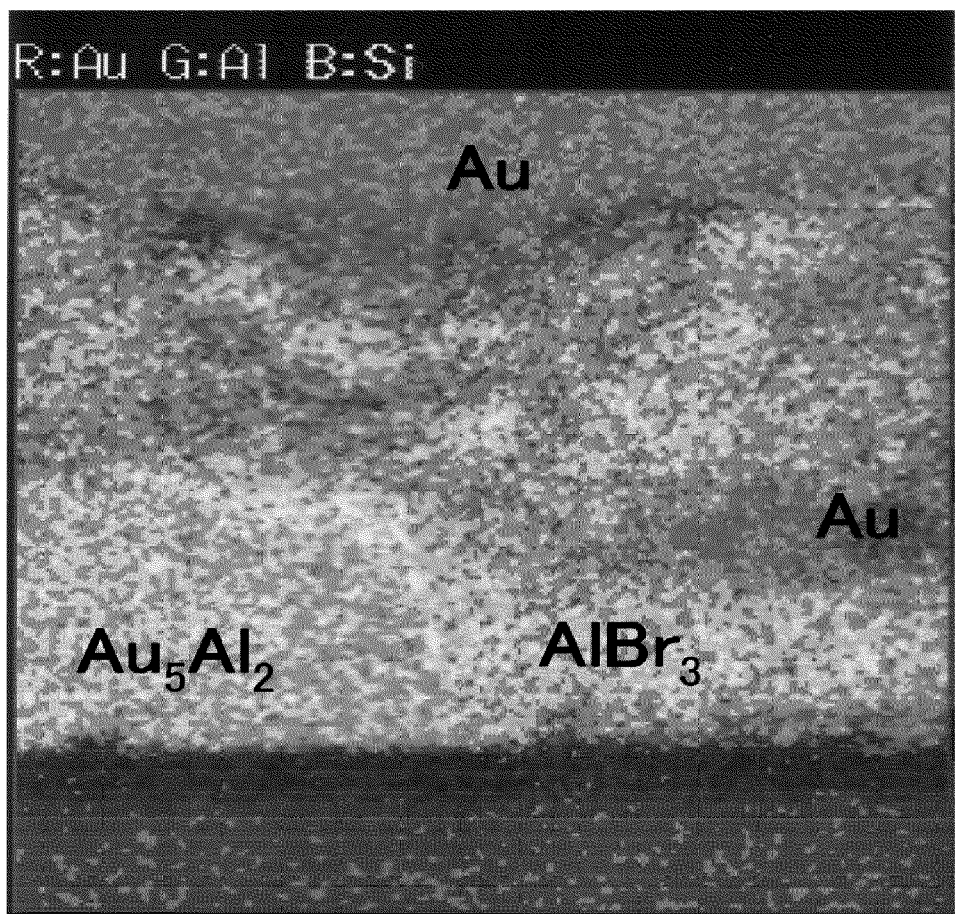
FIG. 17 is a view showing an SEM image, illustrating an elemental analysis map of FIG. 16, useful in describing a mechanism of a failure.

The semiconductor device 200 was stored at 200 degree C. for 1,250 hours. After such storage, the semiconductor device 200 is cooled to an ambient temperature, and then the junction of the Al pad 207 with the Au ball 213 is observed by means of scanning electron microscope (SEM). FIG. 15 is a view showing an optical microscope image of cross sections of the Al pad 207 (in FIG. 15, numeral number is not assigned), the Au ball 213 (in FIG. 15, numeral number is not assigned) and the Au wire 211 (in FIG. 15, numeral number is not assigned), and FIG. 16 is a view showing an SEM image of an enlarged view of a region surrounded with a square in FIG. 15. FIG. 17 is a view showing an SEM image, illustrating an elemental analysis map of FIG. 16. In this sample, an AuAl alloy layer was in a very brittle condition. Besides, it can be also seen from FIG. 15 to FIG. 17 that Au is distributed over a network pattern in the AuAl alloy layer, and it is estimated that the brittle portion is $AlBr_3$.

Figure 18:
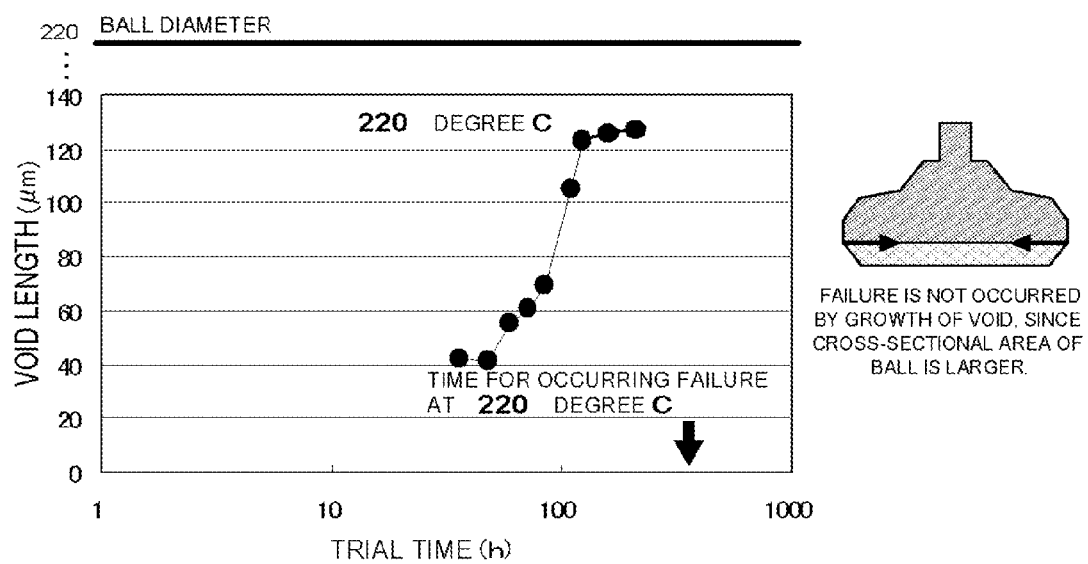
FIG. 18 is a graph, showing a relationship of growing length of void with trial time in the conventional semiconductor device, useful in describing a mechanism of a failure.

FIG. 18 is a graph, showing a relationship of growing length of void (μm) with trial time (hr) in the semiconductor device 200 employing the Au wire 211 having a wire diameter of 70 μm under the condition of being stored at 220 degree C., together with a failure generation time. As shown in FIG. 18, a ball diameter of the Au ball 213 was approximately 220 μm. The failure generation time means a time, at which a VF (forward voltage) failure is detected, and is indicated by a downward arrow in FIG. 18.

It can be seen from FIG. 18 that a failure generation was detected after a rapid growth of the void length was stopped. It is considered that, when the larger diameter of 70 μm is employed, the diameter and the cross sectional area of the Au ball 213 is correspondingly larger, and therefore the growth of voids is not the dominant factor for the failure generation.

By summarizing the above results and knowledge, it can be considered that the failure is generated according to the following mechanism, when the Au wire 211 having the wire diameter of 70 μm is employed. FIG. 19 is a schematic diagram, describing the mechanism of the generation of failure. It is considered that, as shown in FIG. 19, when the wire diameter is larger, the generation of voids does not promptly cause a failure, and the reaction presented by the above-described formula (6) is proceeded by an oxidation of Br ion against $Au_4Al$ that is created in a storage at a higher temperature for longer term, and therefore a reaction for generating Au and $AlBr_3$ at the interface between the Al pad 207 and the Au ball 213. Since $AlBr_3$ produced by the reaction presented by the above-described formula (6) has higher electric resistance, it is considered that an increase of the production provides an increased VF, leading to a generation of a failure. Consequently, it is considered that, when the Au wire 211 having the wire diameter of 70 μm is employed, the growth of the high resistance layer due to the generation of $AlBr_3$ according to the chemical reaction presented by the above-described formula (6) is the dominant factor for the generation of the failure.

According to the results of the above-mentioned analysis, it is found that a failure is occurred due to the progress of the reactions presented by the above-described formula (1) to formula (6), when the semiconductor device 200 that employs the Au wire 211 and the encapsulating resin 215, which contains brominated epoxy resin, is stored at higher temperature, although the dominant factor may be changed depending upon the diameter of the Au wire 211.

Consequently, progresses of the reactions presented by the above-described formula (1) to formula (6) and exemplary implementations of configurations of the apparatus for inhibiting a generation of correspondingly occurred failure will be next described.

(First Embodiment)

Figure 1:
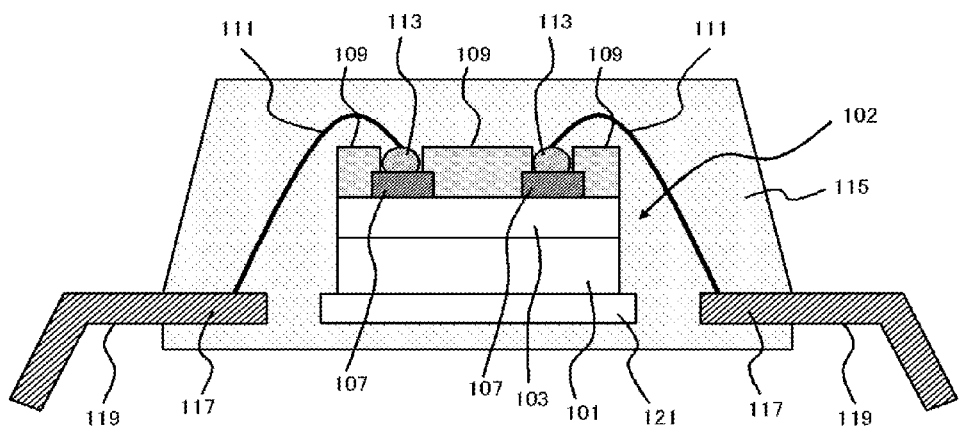
FIG. 1 is a cross-sectional view, illustrating a configuration of a semiconductor device according to an embodiment.
Figure 2:
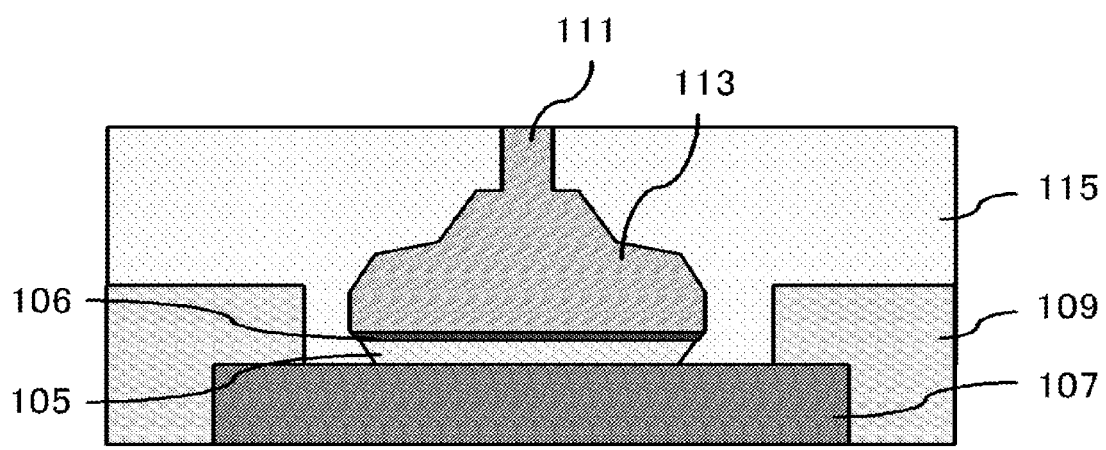
FIG. 2 is an enlarged cross-sectional view, illustrating a configuration of the semiconductor chip of the semiconductor device shown in FIG. 1.

FIG. 1 is a cross-sectional view, illustrating a configuration of a semiconductor device of the present embodiment. FIG. 2 is an enlarged cross-sectional view, illustrating a configuration of peripheral portions of a region where an electrode pad of a semiconductor device 100 shown in FIG. 1 is joined to a bonding wire.

The semiconductor device 100 shown in FIG. 1 and FIG. 2 includes a semiconductor chip 102, electrode pads (Al pads 107) provided in the semiconductor chip 102, and wires (AuPd wire 111) for connecting respective connecting terminals (inner leads 117) provided outside of the semiconductor chip 102 to the semiconductor chip 102. Ball-shaped AuPd balls 113 are formed at the leading edges of the AuPd wires 111. The Al pads 107 and the AuPd balls 113 on the respective leading edges of the AuPd wires 111 are encapsulated with the encapsulating resin 115.

The AuPd wire 111 contains a metal presented by the following formula (I), and the encapsulating resin 115 contains substantially no halogen. The resin in the encapsulating resin 115 is composed of a polymer compound, which is substantially free of Br group in molecular structure.

$$AuM \quad (I)$$

(wherein M includes at least one selected from the group consisting of Pd, Cu, Ag and Pt).

In the present embodiment, the metal presented by the above-described formula (I) contains Pd.

An unevenly distributed region of M contained in the metal presented by the above-described formula (I) (Pd segregated region 106) is included in vicinity of the connecting region with the Al pad 107 in the AuPd ball 113 located at the leading edge of the AuPd wire 111.

The Pd segregated region 106 may clearly and visibly exist at the time of completing the manufacture of the semiconductor device 100. The Pd segregated region 106 appears by a heat treatment process after implementation more definitely. Further, the Pd segregated region 106 may be a metallic region that is generated in a periphery of a region, which is formed by diffusions of a metal (Al) contained in the Al pad 107 and a metal (Au) contained in the AuPd wire 111, and the metallic region may be composed of alloy. The Pd segregated region 106 may be a region, in which Pd is relatively concentrated in the AuPd ball 113 by a segregation.

In vicinity of the connecting region of the Al pad 107 with the AuPd ball 113, a layer of an alloy of Al and Au (AuAl alloy layer 105) is included between the Al pad 107 and the Pd segregated region 106.

The Pd segregated region 106 functions as a diffusion barrier region, which inhibits diffusions of a metal contained in the Al pad 107 and a metal contained in the AuPd ball 113, and therefore is a barrier region that provides an inhibition to a growth of the AuAl alloy layer 105. The Pd segregated region 106 may be provided as a layered structure. Having such structure, further growth of the AuAl alloy layer 105 during the heating thereof can be more surely inhibited.

The constitutions of the semiconductor device 100 will be more specifically described as follows. In the semiconductor device 100, the semiconductor chip 102 is provided on a lead frame 121, and these are encapsulated with the encapsulating resin 115. Lead frames 119 are provided in the lateral sides of the lead frame 121. Portions of the lead frames 119 are encapsulated with the encapsulating resin 115 to form the inner leads 117.

The semiconductor chip 102 has a configuration, in which a multiple-layered film 103 of an interconnect layer, an insulating interlayer and the like are provided on the silicon substrate 101. The Al pads 107 are provided at predetermined locations on the multiple-layered film 103, and a polyimide film 109 coats the entire side surface and a portion an upper surface of the Al pad 107. Portions of the upper surface of the Al pad 107 which are not covered with the polyimide film 109, are exposed. The exposed portions of the Al pad 107 are electrically connected to the inner leads 117 via AuPd wires 111. The AuPd ball 113 is formed at one end of the AuPd wire 111, where the Al pad 107 is joined to the AuPd ball 113. In the junction region of the AuPd ball 113 with the Al pad 107, the AuAl alloy layer 105 is provided on the bottom of the AuPd ball 113, and the Pd segregated region 106 is provided in the periphery of the AuAl alloy layer 105, or more specifically on the AuAl alloy layer 105. The junction of the Al pad 107 with AuPd ball 113 is covered with the encapsulating resin 115.

In the semiconductor device 100 having such configuration, each of the AuPd wire 111 and the AuPd ball 113 is composed of AuPd alloy that primarily contains Au. Contents of Pd in AuPd alloy may be, for example, equal to or higher than 0.1% wt. Such content is more effective in creating the Pd segregated region 106. Consequently, a growth of the AuAl alloy layer 105 in the junction region between the AuPd ball 113 and the Al pad 107 can be more surely inhibited. The content of Pd in AuPd alloy may also be, for example, equal to or lower than 2% wt. Having such configuration, an increase in the electric resistance of the AuPd wire 111 can be prevented, while fully assuring an effect for inhibiting the growth of the AuAl alloy layer, and further, a serious damage becomes less to be given to the Al pad 107. More specific formulation of AuPd alloy may be an Au concentration of 99% wt. and a Pd concentration of 1% wt.

A wire diameter ϕ of the AuPd wire 111 may be selected according to a dimension of the Al pad 107, a degree of integration of the Al pad 107 or the like. More specifically, the wire diameter of AuPd wire 111 may be not less than 20 μm and not more than 70 μm. The wire diameter of equal to or more than 20 μm provides further improved connecting reliability with the Al pad 107. On the contrary, the wire diameter of equal to or less than 70 μm provides further dense arrangement with narrower intervals between the Al pads 107, thereby providing further dense connecting between the Al pad 107 and the inner lead 117.

The AuAl alloy layer 105 is a layered region, which is created by the diffusions of Al in the Al pad 107 and Au in the AuPd ball 113 during the heating in forming the junction, and primarily contains Au and Al. Here, "to primarily contain Au and Al" means that a combination of the content of Au and the content of Al over the entire AuAl alloy layer 105 is larger than 50% wt.

Further, the Pd segregated region 106 is a region of the AuPd ball 113, in which Pd in the AuPd ball 113 is concentrated to provide relatively higher Pd concentration. In addition, the Pd segregated region 106 is a region where the Pd concentration is higher than that in the AuPd wire 111.

While the configuration having the AuAl alloy layer 105 and the Pd segregated region 106, which are stacked in this sequence on the bottom of AuPd ball 113 is illustrated in FIG. 2, the semiconductor device 100 may have an alternative configuration, in which the Pd segregated region 106 for obstructing the growth of the AuAl alloy layer 105 is clearly and visibly created in at least a portion of the AuPd ball 113 by heating, and further, in the semiconductor device 100 in the status of a pre-operation, the AuAl alloy layer 105 and the Pd segregated region 106 are not required to form a visible layer structure. As will be discussed later, even though the Pd segregated region 106 does not form a visible layer structure in the semiconductor device 100 in the status of a pre-operation, the Pd segregated region 106 more clearly appears when the operation of the semiconductor device 100 is started and correspondingly a vicinity of the connecting region between the AuPd ball 113 and the Al pad 107 is heated.

The encapsulating resin 115 is a heat resistant resin, composed of a resin composition that substantially contains no halogen and no antimony. In addition, the resin contained in the encapsulating resin 115 is composed of a polymer compound that is substantially free of halogen group in molecular structure. Further, the encapsulating resin 115 is free of halide in the components except the resin, more specifically for example, in additives such as fire retardant agent and the like. Such type of the resin compositions more specifically includes: a resin composition containing a resin employing an alternative fire retardant agent such as a metal hydrate and the like;

a high filler-loading resin composition that contains a filler such as a fused spherical silica and the like at a higher ratio of, for example, equal to or higher than 80% wt;

and a resin composition that contains a polymer compound having fire retardant molecular structure such as a phenolic resin, epoxy resin and the like. These may be employed alone, or by means of a combination thereof.

The metal hydrate may more specifically include aluminum hydroxide, magnesium hydroxide and the like. Other alternative fire retardant agents may include, more specifically, inorganic phosphorus, an organic phosphorus compound and the like.

Further, the encapsulating resin 115 may contain one type of resin, or may contain multiple types of resins.

Phenolic resins having fire retardant molecular structure may include, for example, a novolac-type phenolic resin having biphenyl derivatives or naphthalene derivatives in its molecule. More specifically, such phenolic resins may include:

phenol aralkyl resins such as phenol biphenylene aralkyl resins, phenol phenylene aralkyl resins, phenol diphenyl ether aralkyl resins and the like;
bisphenol fluorene-containing phenolic novolac resins;
bisphenol S-containing phenolic novolac resins;
bisphenol F-containing phenolic novolac resins;
bisphenol A-containing phenolic novolac resins;
naphthalene-containing phenol novolac resins;
anthracene-containing phenolic novolac resins;
fluorene-containing phenolic novolac resins; and
condensed polycyclic aromatic phenolic resins.

These may be employed alone, or by means of a combination thereof.

Further, epoxy resins having fire retardant molecular structure may include novolac epoxy resins containing biphenyl derivatives or naphthalene derivatives in their molecules. More specifically, such epoxy resins may include:

phenol aralkyl epoxy resins such as phenol biphenylene aralkyl epoxy resins, phenol phenylene aralkyl epoxy resin, phenol diphenyl ether aralkyl epoxy resin and the like;
bisphenol fluorene-containing novolac epoxy resins;
bisphenol S-containing novolac epoxy resins;
bisphenol F-containing novolac epoxy resins;
bisphenol A-containing novolac epoxy resins;
naphthalene-containing novolac epoxy resins;
anthracene-containing novolac epoxy resins;
fluorene-containing novolac epoxy resins; and
condensed polycyclic aromatic epoxy resins.

These may be employed alone, or by means of a combination thereof.

Next, a process for manufacturing the semiconductor device 100 will be described.

First of all, a multiple-layered film 103 including an interconnect layer, an insulating interlayer and the like is formed on silicon substrate 101. Next, the Al pads 107 are formed in predetermined locations on the multiple-layered film 103 via a sputtering process. Subsequently, the polyimide film 109 is formed via a coating process so as to cover the Al pads 107. Subsequently, the polyimide film 109 is patterned to provide openings, thereby exposing portions of the Al pads 107. In this way, the semiconductor chip 102 is obtained.

The obtained semiconductor chip 102 is mounted on the lead frame 121, and wire bondings between the Al pads 107 and the inner leads 117 are achieved via the AuPd wires 111. The AuPd balls 113 are formed in this occasion. Further, Pd is uniformly distributed in the AuPd wire 111 in the initial wire condition, and then is segregated by the wire bonding process to create the Pd segregated region 106 in vicinity of the connecting region. Thereafter, the lead frame 121, the semiconductor chip 102, the AuPd wires 111 and the inner leads 117 are encapsulated with the encapsulating resin 115. According to the above-mentioned procedure, the semiconductor device 100 shown in FIG. 1 and FIG. 2 is obtained. The AuAl alloy layer 105 and the Pd segregated region 106 shown in FIG. 2 are included in the obtained semiconductor device 100, and the Pd segregated region 106 is more clearly appeared by conducting the operation of the semiconductor device 100 thereafter.

Next, the advantageous effect obtainable by employing the configuration of the semiconductor device 100 will be described.

In semiconductor device 100 shown in FIG. 1 and FIG. 2, the bonding wire connected to the Al pad 107 is the AuPd wire 111 composed of AuPd alloy, and the connecting portion is encapsulated with the encapsulating resin 115 composed of the resin composition that substantially contain no halogen. Consequently, these synergistic effect can provide inhibitions in the counter diffusion of Au and Al at the interface between the Al pad 107 and the AuPd ball 113 and in the corresponding further growth of the AuAl alloy layer 105, and a corrosion of the AuAl alloy layer 105 by halogen in the encapsulating resin 115 can be inhibited. Consequently, the growth of voids and the growth of the high resistance layer caused by the corrosion of the AuAl alloy layer 105 can be inhibited. Thus, the configuration exhibiting an improved junction reliability in the operation at higher temperature can be presented.

This advantageous effect will be further described in detail below, by means of comparisons with the conventional configurations.

Figure 3A:
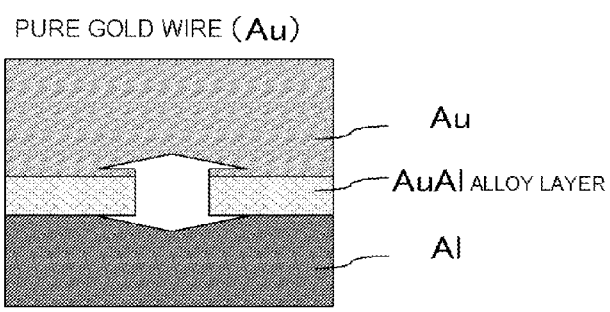
FIGS. 3A and 3B are cross-sectional views, illustrating the configuration of vicinity of the junction of the electrode pad with the bonding pad.
Figure 3B:
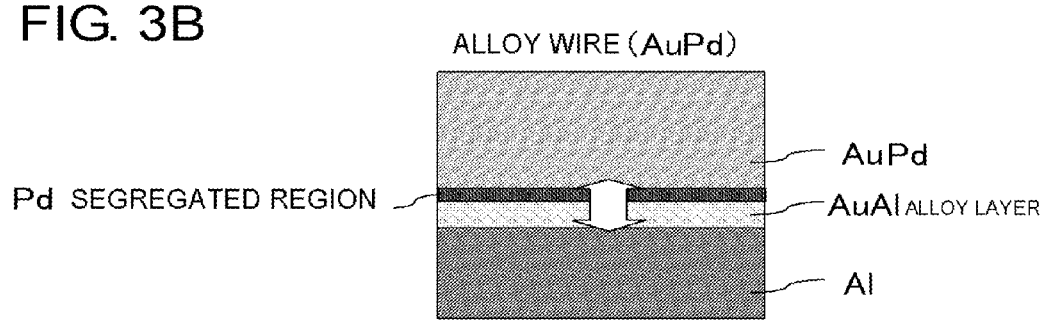

First of all, effects of inhibition in and prevention from the growth of the alloy layer at the interface of the Al pad 107 with the AuPd ball 113 will be described in reference to FIG. 3A and FIG. 3B. FIG. 3A and FIG. 3B are cross-sectional views, illustrating a configuration near the interface of the electrode pad with the bonding wire. FIG. 3A corresponds to a configuration of a conventional semiconductor device, which employs Al for the material of the electrode pad and pure gold (Au) wire for the material of the bonding wire. On the contrary, FIG. 3B corresponds to the configuration of the semiconductor device 100 shown in FIG. 1 and FIG. 2, which employs Al for the material of the electrode pad and alloyed wire (AuPd) for the material of the bonding wire.

In the case of the configuration shown in FIG. 3A, no barrier layer for inhibiting a counter diffusion of the AuAl alloy layer at a junction interface of the electrode pad with the bonding wire is formed. Consequently, the AuAl alloy layer described above grows at higher temperature, according to the reactions of the above-described formula (1) to formula (5).

On the contrary, in the case of the semiconductor device 100, since the material of the bonding wire is a solid solution of AuPd, the AuAl alloy layer 105 is created in the wire bonding process, and Pd is extracted from AuPd to form the Pd segregated region 106. Then, as shown in FIG. 3B, when the semiconductor device 100 is stored in the condition of higher temperature, AuAl alloy slightly grows to form the AuAl alloy layer, and the Pd segregated region, in which Pd is concentrated, more considerably appears between the AuAl alloy layer and the AuPd layer. Since the Pd segregated region functions as a barrier layer for reducing the transfer rate of Au, growth of the AuAl alloy layer is inhibited.

Figure 4:
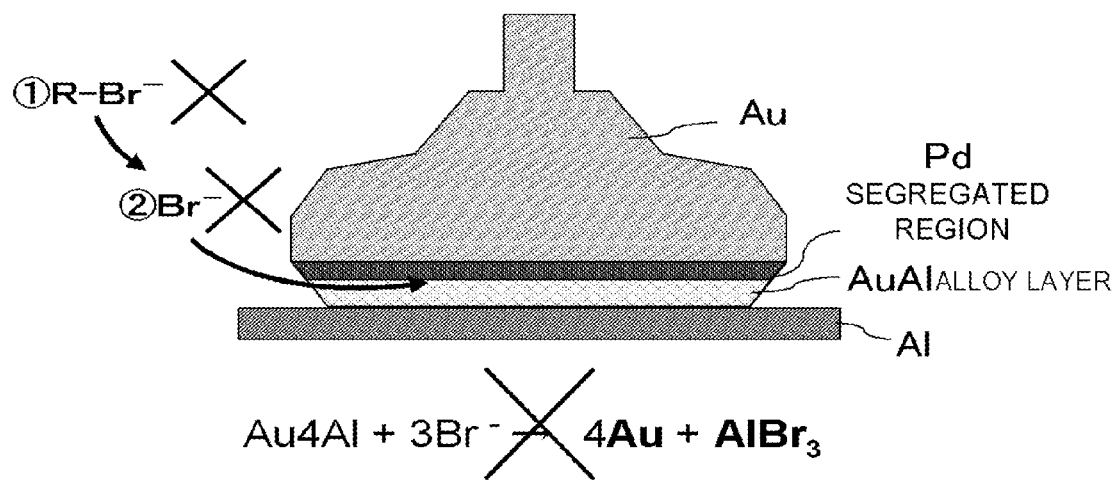
FIG. 4 is a cross-sectional view, illustrating the configuration of vicinity of the junction of the electrode pad with the bonding pad.

FIG. 4 is a cross-sectional view for describing an interaction of the bonding wire having a cross section structure shown in FIG. 3B with the encapsulating resin. As shown in FIG. 4, the semiconductor device 100 is configured that the whole apparatus is encapsulated with the fire retardant encapsulating resin 115, which is substantially free of halogen such as Br and the like. Consequently, formation of brominated aluminum presented by the above-described formula (6) by a reaction of the AuAl alloy layer that exists in the junction with the electrode pad in a very small amount with Br ion derived from the encapsulating resin is prevented, so that the corrosion of the alloy layer is prevented.

As such, since the semiconductor device 100 according to the present embodiment is configured that gold alloy containing a metal that functions as a barrier layer for the growth of alloy is employed for the material of the bonding wire, and since the corrosion of AuAl alloy generated in a very small amount caused by halogen is inhibited, these synergistic effect can provide a considerably improved connecting reliability in an operation at higher temperature for longer term, as compared with the conventional configuration, which is designed on the basis of employing an encapsulating resin that is composed of a resin composition containing halogen.

Consequently, the semiconductor device 100 is configured to exhibit an improved operability ay higher temperature.

As described before in reference to FIG. 9 to FIG. 23, it is considered that a connecting failure between the electrode pad and the bonding wire is generally caused by the chemical reactions presented by the above-described formula (1) to formula (6), and the type of the dominant factor in these reactions depends upon the wire diameter. On the contrary, in the semiconductor device 100 according to the present embodiment, an improved junction reliability in the operation at higher temperature can be provided, regardless of the diameter of the AuPd wire 111.

For example, when the AuPd wire 111 has relatively smaller wire diameter of about 20 μm, generation of voids by a shrinkage of brominated aluminum created by the corrosion reaction presented by the above-described formula (6) can more effectively inhibited. On the contrary, when the AuPd wire 111 has relatively larger wire diameter of about 70 μm, growth of brominated aluminum layer having higher resistance by the corrosion reaction presented by the above-described formula (6) can more effectively inhibited.

In the following embodiments, descriptions will be made focusing on specific features that are different from first embodiment.

(Second Embodiment)

While the description is made in first embodiment by illustrating the case of employing AuPd alloy for the material of the bonding wire connected to the Al pad 107, the material for the bonding wire is not limited thereto, and a metal presented by the following formula (I) and more specifically gold alloy presented by the following formula (I) may also be employed:

$$AuM \qquad (I)$$

(wherein M includes at least one selected from the group consisting of Pd, Cu, Ag and Pt).

Since Au, and Pd, Cu, Ag and Pt are noble metals, the storage stability of the semiconductor device 100 can be improved by employing metals presented by the above-described formula (I) for the material of the bonding wire. Further, since Au, and Pd, Cu, Ag and Pt are metals having lower resistance, the Al pad 107 can be electrically connected to the inner lead 117 in an effective manner.

Further, the junction reliability with the electrode pad in the operation at higher temperature can be improved by employing metals presented by the above-described formula (I) for the material of the bonding wire. It is considered that the factor for such improvement is that metal presented by M in the above-described formula (I) is segregated at the interface of the AuAl alloy layer 105 with the AuM layer, and the segregated region containing M functions as a barrier region. It is also considered that another factor for such improvement is that the strength of the bonding wire can be improved by employing alloy containing at least one of Pd, Cu, Ag and Pt.

Metal presented by the above-described formula (I) may contain Au, Pd and Cu. More specifically, AuPdCu alloy may be preferably employed for other Au alloy composing the wire bonding. Formulation of AuPdCu alloy may be, for example, Pd 0.8% wt., Cu 0.1% wt. and Au 99.1% wt. Alternatively, AuAg alloy composed of Au 90% wt. and Ag 10% wt. may also be employed.

(Third Embodiment)

While the description is made in the above embodiments by illustrating the case of providing the connecting of the electrode pad with the inner lead via the bonding wire, the configuration of the terminal for external connecting that is connected to one of the bonding wire, the other end of which is connected to the electrode pad, is not limited to the inner lead, and other suitable member may also be employed. For example, a wire bonding may be made from an electrode pad of a semiconductor chip to an interconnect provided on a printed circuit board.

Figure 5:
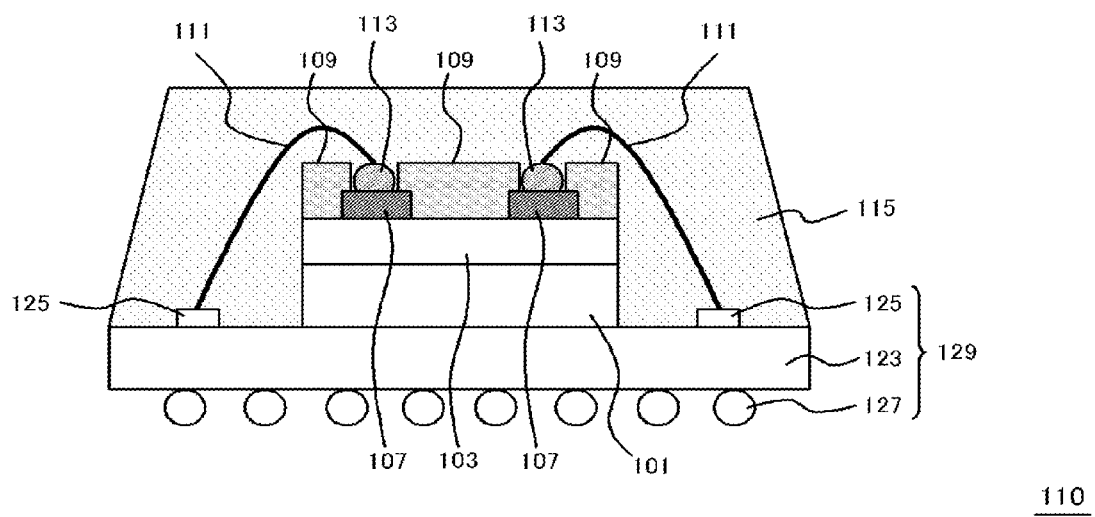
FIG. 5 is a cross-sectional view, illustrating a configuration of a semiconductor device according to an embodiment.

FIG. 5 is a cross-sectional view, illustrating a configuration of a semiconductor device of such configuration. Basic configuration of the semiconductor device 110 shown in FIG. 5 is similar to the configuration of the semiconductor device 100 shown in FIG. 1, except that a ball grid array (BGA) substrate 129 is provided, in place of the lead frame 121 and the lead frame 119. The BGA substrate 129 has a printed circuit board 123, on which a semiconductor chip 102 is mounted, interconnects 125 provided in predetermined locations on the printed circuit board 123, and a plurality of bumps 127 provided on a back surface of a chip-mounting surface of the printed circuit board 123. AuPd wires 111 are connected to Al pads 107 and the interconnects 125. Whole chip-mounting region of the printed circuit board 123 is encapsulated with an encapsulating resin 115.

In the semiconductor device 110 shown in FIG. 5, since the AuPd wire 111 is employed for the bonding wire connected to the pad 107 and the fire retardant encapsulating resin 115 being free of halogen is employed, advantageous effects that are similar to that obtainable by the semiconductor device 100 shown in FIG. 1 can be obtained.

While the preferred embodiments of the present invention have been described above in reference to the annexed figures, it should be understood that the disclosures above are presented for the purpose of illustrating the present invention, and various configurations other than the above described configurations can also be adopted.

For example, while the description is made in the above embodiments by illustrating the case of employing Al for the material of the electrode pad, the material of the electrode pad is not limited thereto, and various conductive materials including other types of metals and metallic compounds such as AlSi, AlCu, AlSiCu, Cu and the like may also be employed.

In addition, while the description is made in the above embodiments by illustrating the case of the semiconductor device having the configuration, in which the polyimide film 109 is provided on the Al pad 107, alternative configuration having no polyimide film 109 provided thereon may also be employed.

Further, the technology of the present invention may be applicable to various types of semiconductor packages that are encapsulated with a resin such as epoxy resin, and it is needless to say that the configuration thereof is not limited to the configurations described in the above-described embodiments, such as packages of BGA.

EXAMPLES

In the following experiments, a semiconductor device having a configuration, which is same as the semiconductor device 100 described in first embodiment in reference to FIG. 1, and semiconductor devices having configurations, which also have the structure shown in FIG. 1 but have bonding wires of different material and an encapsulating resin of different material, were manufactured, and evaluations in light of the life time under a condition at a temperature of 175 degree C. and comparisons in light of the growing rates of the AuAl alloy layer were conducted. The wire diameter of the bonding wire was set to 20 μm in the following experiments.

Experiment 1

Pure Gold (Au) Lines were Employed for the Bonding Wires, in Place of the AuPd wire 111. Further, a resin composition containing brominated epoxy resin was employed for the encapsulating resin.

Experiment 2

AuPd was employed for the material of the bonding wires. Formulation of alloy composing the AuPd wire 111 was Pd 1% wt. and Au 99% wt. Further, a resin composition containing brominated epoxy resin was employed for the encapsulating resin.

Experiment 3

Pure gold (Au) lines were employed for the bonding wires, in place of the AuPd wire 111. Further, a resin composition of substantially free of halogen was employed for the encapsulating resin 115.

Experiment 4

The semiconductor device 100 described in first embodiment in reference to FIG. 1 was manufactured. AuPd was employed for the material of the bonding wires. More specifically, formulation of alloy composing the AuPd wire 111 was Pd 1% wt. and Au 99% wt. Further, a resin composition of substantially free of halogen was employed for the encapsulating resin 115.

(Evaluations)

FIG. 6 is a table, describing results of evaluations in estimated life of semiconductor devices of experiment 1 to experiment 4, which were stored at 175 degree C. In FIG. 6, the estimated life was determined by a time when a failure in forward voltage (VF) was detected, when critical value of cumulative fraction defective F was: F=10(%). As shown in FIG. 6, while certain levels of the life-extension effects over experiment 1 were obtained in experiment 2 and experiment 3, a remarkable level of the life-extension effect, which greatly exceeds sum of the effects obtained in experiment 2 and experiment 3, was obtained in experiment 4. These results show that, while certain levels of the effects in the life of the device are obtained by having configurations, which involve employing either the AuPd wire 111 or the encapsulating resin that is substantially free of halogen alone, a combined use of the AuPd wire 111 and the encapsulating resin that is substantially free of halogen provides a significant advantageous effect for extending the life of the device under the condition of the storage at higher temperature by these synergistic effect.

Figure 7:
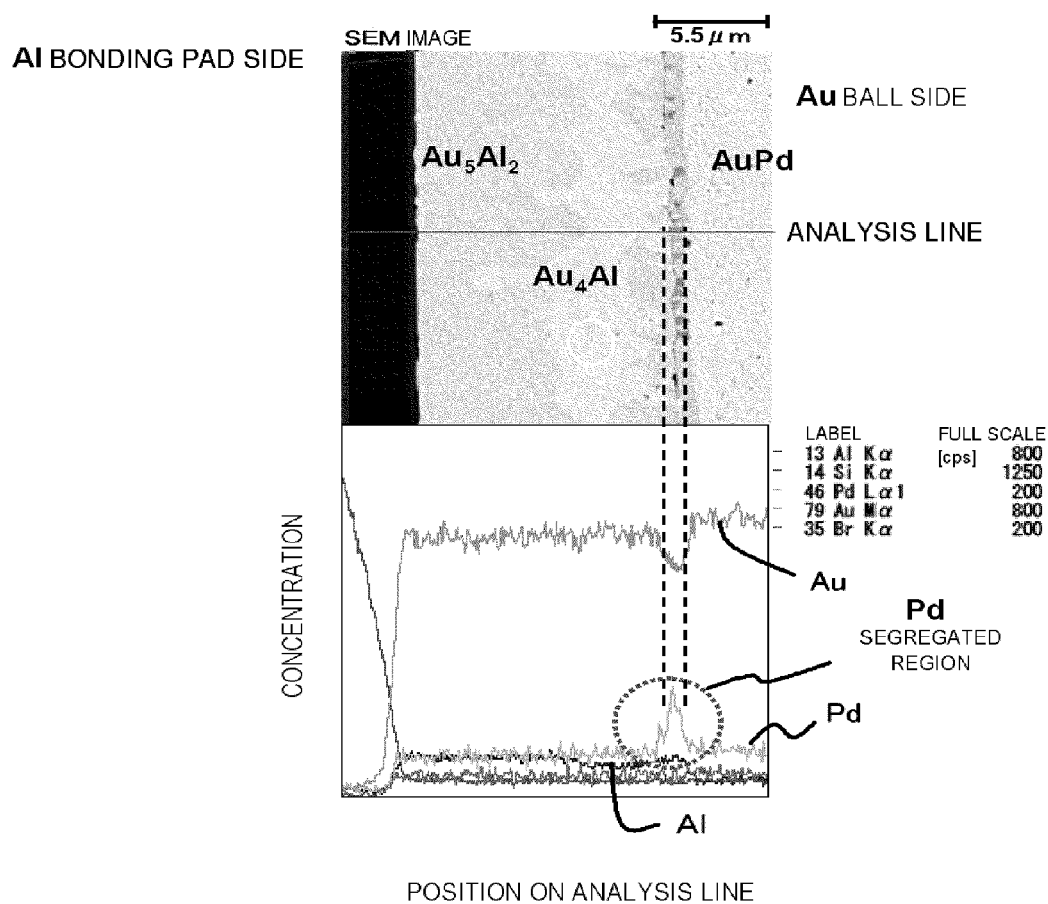
FIG. 7 includes a view showing an SEM image of a semiconductor device according to the example, and a chart of elemental analysis results.

FIG. 7 includes a view showing an SEM image of a peripheral portion of a junction region between the Al pad 107 and the AuPd ball 113 of the stored semiconductor device according to experiment 4, and a chart of elemental analysis results. As can be seen from FIG. 7, a Pd unevenly distributed region or Pd segregated region 106, in which Pd in AuPd wire was concentrated, is formed as a layered form in vicinity of a connecting portion of the multiple-layered film 103 with the Al pad 107. Further, it is also shown that an Au4Al layer is remarkably formed in the side of the bonding pad, rather than in the side of the Pd unevenly distributed region 106.

Figure 8:
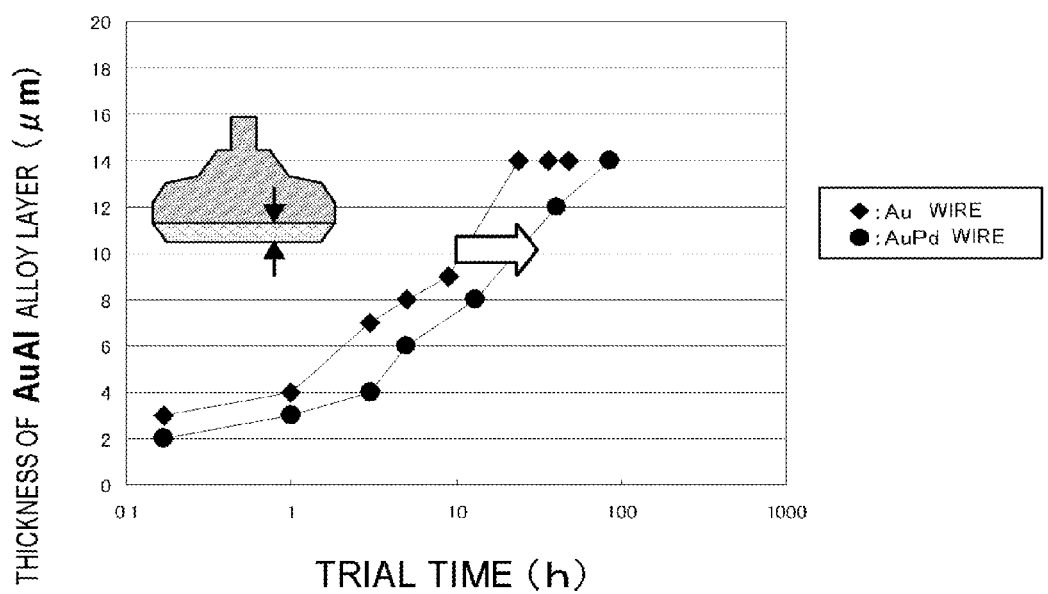
FIG. 8 is a graph, showing the change of the thickness of the AuAl alloy layer of the semiconductor devices in the example over the storage time.

FIG. 8 is a graph, showing the change of the thickness of the AuAl alloy layer (μm) of the semiconductor devices in experiment 2 and experiment 4 over the storage time at 175 degree C. (hr). As can be seen from FIG. 8, it is understood that the growing rate of the alloy layer is reduced by employing AuPd for the material of the bonding wire.

It is apparent that the present invention is not limited to the above embodiment, that may be modified and changed without departing from the scope and spirit of the invention.

FIG. 20 is a table, describing a relationship of areal ratio of an AuAl alloy portion right after the bonding process conducted at 220 degree C. with life time for the semiconductor device of experiment 4. The areal ratio of the AuAl alloy portion means a ratio of a total area occupied by the AuAl alloy portion in whole area of a junction region between the Al pad 107 and the AuPd ball 113. Although it is ideal that 100% of area of the junction region between the Al pad 107 and the AuPd ball 113 is occupied by the AuAl alloy portion, the AuAl alloy portion is ordinarily formed partially in the junction region, and the ratio thereof varies in response to bonding conditions such as temperature, load, power of an ultrasonic wave and the like employed in the bonding process. As can be seen from FIG. 20, a life time of the semiconductor device that exhibits less than 50% of the areal ratio of the AuAl alloy portion is only about a half of a life time of the semiconductor device exhibiting equal to or higher than 50% the areal ratio of the AuAl alloy portion. In other words, semiconductor device exhibiting longer life time can be obtained by selecting at least 50% of the areal ratio of the AuAl alloy portion. Desired areal ratio of AuAl alloy portion can be obtained by suitably adjusting bonding conditions such as temperature, load, power of ultrasonic wave and the like employed in the bonding process.

What is claimed is:

1. A semiconductor device, comprising:
   a semiconductor chip including an electrode pad provided on the semiconductor chip, said electrode pad containing Al as a major constituent;
   a bonding wire connected to said electrode pad; and
   an encapsulating resin encapsulating at least said electrode pad and said bonding wire,
   wherein:
      said encapsulating resin contains no Sb and substantially no Sr,
      said bonding wire including a metal according to Formula (I): AuM, wherein M includes at least one selected from the group consisting of Pd, Cu, Ag and Pt.

2. The semiconductor device according to claim 1, further comprising:
   a lead, a part of said lead being encapsulated in said encapsulating resin to form an inner lead and a part of said lead being exposed from said encapsulating resin to form an outer lead,
   wherein said bonding wire is further connected to said inner lead, and
   said encapsulating resin further encapsulates a connection portion between said bonding wire and said inner lead.

3. The semiconductor device according to claim 2, further comprising:
   a die pad lead on which said semiconductor chip is mounted,
   wherein said encapsulating resin further encapsulates said semiconductor chip and said die pad lead.

4. The semiconductor device according to claim 1, further comprising:
   a ball grid array substrate including a printed circuit board,
   wherein said bonding wire is further connected to an interconnect formed on said printed circuit board, and
   said encapsulating resin further encapsulates a connecting portion between said bonding wire and said interconnect.

5. The semiconductor device according to claim 1, wherein said electrode pad further includes at least one of Si or Cu.

6. The semiconductor device according to claim 2, wherein said electrode pad further includes at least one of Si or Cu.

7. The semiconductor device according to claim 1, wherein said bonding wire contains Au and Pd.

8. The semiconductor device according to claim 7, wherein said bonding wire further contains at least one of Cu, Ag or Pt.

9. The semiconductor device according to claim 1, wherein said metal contains Au and Cu.

10. The semiconductor device according to claim 9, wherein said metal further contains Pt.

11. The semiconductor device according to claim 1, wherein said metal contains Au and Ag.

12. The semiconductor device according to claim 11, wherein said metal further contains at least one of Cu or Pt.

13. The semiconductor device according to claim 1, wherein said encapsulating resin comprises a resin composed of a polymer compound. the polymer compound containing Br of less than or equal to 100 ppm in concentration.

14. The semiconductor device according to claim 1 wherein said connecting portion comprises an unevenly distributed region of M in the metal presented by Formula (1) formed between said electrode pad and said bonding wire.

* * * * *